(12) United States Patent
Flükiger

(10) Patent No.: US 8,372,784 B2
(45) Date of Patent: Feb. 12, 2013

(54) PROCEDURE OF DENSIFYING FILAMENTS FOR A SUPERCONDUCTIVE WIRE

(75) Inventor: René Flükiger, Plan-les-Onates (CH)

(73) Assignee: Bruker Biospin AG, Faellanden (CH)

( * ) Notice: Subject to any disclaimer, the term of this patent is extended or adjusted under 35 U.S.C. 154(b) by 806 days.

(21) Appl. No.: 12/585,914

(22) Filed: Sep. 29, 2009

(65) Prior Publication Data

US 2010/0087324 A1 Apr. 8, 2010

(30) Foreign Application Priority Data

Oct. 6, 2008 (EP) ..................................... 08017483

(51) Int. Cl.
*H01L 39/24* (2006.01)
*H01B 12/06* (2006.01)

(52) U.S. Cl. ........ 505/431; 505/432; 505/433; 505/490; 505/491; 505/822; 174/125.1; 29/599; 264/667; 264/614; 264/658

(58) Field of Classification Search .......... 505/230–232, 505/430–433, 490–492, 500, 704, 739, 740, 505/784, 822, 917–921; 174/125.1; 29/599, 29/825; 149/96, 98; 264/604, 667, 614, 264/620, 658; 428/662, 930
See application file for complete search history.

(56) References Cited

U.S. PATENT DOCUMENTS

| 5,656,574 A * | 8/1997 | Ravi-Chandar et al. ....... 505/121 |
| 6,195,870 B1 * | 3/2001 | Zhu et al. ......................... 29/599 |
| 6,221,813 B1 * | 4/2001 | Riedel et al. ................... 505/432 |
| 6,555,503 B1 * | 4/2003 | Li et al. .......................... 505/432 |

OTHER PUBLICATIONS

P. Kovac et al., "Properties of stabilized MgB$_2$ composite wire with Ti barrier", Supercond. Sci. Technol. 20 (2007) 771-776.
E.W. Collings et al., "Prospects for improving the intrinsic and extrinsic properties of magnesium diboride superconducting strands", Supercond. Sci. Technol. 21 (2008) 103001 (14pp).
M.S.A. Hossain et al., "Significant enhancement of $H_{C2}$ and $H_{irr}$ in MgB$_2$ + C$_4$H$_6$O$_5$ bulks at a low sintering temperature of 600 °C", Supercond. Sci. Technol. 21 (2007) L51 -L54.

(Continued)

*Primary Examiner* — Stanley Silverman
*Assistant Examiner* — Kallambella Vijayakumar
(74) *Attorney, Agent, or Firm* — Paul Vincent

(57) ABSTRACT

A method for producing a superconductive wire, whereby an elongated intermediate element is formed out of an initial element in a deformation step and whereby the superconductive filaments are formed by a final reaction heat treatment, is characterized in that prior to the final reaction heat treatment the filaments in the intermediate element are densified in one or more high pressure densification steps following up the deformation step, said densification steps comprising a simultaneous action of at least four hard surfaces perpendicular to the axis of the elongated intermediate element, building up high pressure P≧100 MPa on a part of the intermediate element having an axial length L. This leads to a substantial increase of the critical current density $J_c$, whereby the anisotropy factor Γ is be almost not affected thus enabling production of almost isotropic wires or tapes.

19 Claims, 3 Drawing Sheets

OTHER PUBLICATIONS

H. Yamada et al., "The excellent superconducting properties of in situ powder-in-tube processed $MgB_2$ tapes with both ethyltoluene and SiC powder added", Supercond. Sci. Technol. 220 (2007) L30-L33.

A. Serquis, et al., "Hot isostatic pressing of powder in tube $MgB_2$ wires", Applied Physics Letters, vol. 82, No. 17, Apr. 28, 2003, pp. 2847.

S.X. Dou et al., "Enhancement of the critical current density and flux pinning of $MgB_2$ superconductor by nanoparticle SiC doping", Applied Physics Letters, vol. 81, No. 18, Oct. 28, 2002, pp. 3419.

René Fluekiger, et al., "Simultaneous Addition of $B_4C$+SiC to $MgB_2$ Wires and Consequences for $J_c$ and $B_{irr}$", IEEE Transactions on Applied Superconductivity, vol. 17, No. 2, Jun. 2007, pp. 2846.

Paola Lezza et al., "Anisotropy of $J_c$ in Ex Situ $MgB_2$/Fe monofilamentary Tapes", 3196, IEEE Transactions on Applied Superconductivity, vol. 15, Nov. 2, Jun. 2005, pp. 3196.

René Fluekiger et al., "Simultaneous Addition of $B_4C$+SiC to $MgB_2$ Wires and Consequences for $J_c$ and $B_{irr}$", IEEE Transactions on Applied Superconductivity, vol. 17, No. 2, Jun. 2007, pp. 2846.

P. Kovac, et al., "$MgB_2$ tapes made of mechanically alloyed precursor powder in different metallic sheaths", Supercon. Sci. Technol. 21 (2008) 015004 (6pp).

P. Lezza, et al., "Improved critical current densities in $B_4C$ doped $MgB_2$ based wires", Supercond. Sci. Technol. 19 (2006) 1030-1033.

R.H.T. Wilke, et al., "Systematic Effects of Carbon Doping on the Superconducting Properties of $Mg(B_{1-x}C_x)_2$". Physical Review Letters, vol. 92, No. 21, 2004.

T.A. Prikhna, et al., "High-pressure synthesis of $MgB_2$ with and without tantalum additions", Physica C 372-376 (2002) 1543-1545.

\* cited by examiner

PROCEDURE OF DENSIFYING FILAMENTS FOR A SUPERCONDUCTIVE WIRE

This application claims Paris Convention priority of EP 08 017 483.2 filed Oct. 6, 2008 the complete disclosure of which is hereby incorporated by reference.

BACKGROUND OF THE INVENTION

The invention concerns a method for producing a superconductive wire out of an initial element, the superconductive wire comprising finally one or more superconductive filaments having a diameter between 2 µm and 5 mm and being enclosed in a metallic matrix, and further comprising at least one highly conductive ohmic element, whereby an elongated intermediate element with polygonal cross section is formed out of the initial element by applying a sequence of swaging, drawing or rolling deformations in a deformation step, and whereby the superconductive filaments are formed by a final reaction heat treatment between 300° C. and 1200° C.

A method for producing a superconductive wire is known from the article by P. Kováč et al. "Properties of stabilized $MgB_2$ composite wire with Ti barrier", *Supercond. Sci. Technol.* 20(2007)771-776.

The fabrication of $MgB_2$ wires and tapes has reached the industrial level, and kilometer lengths can be produced by means of two competing techniques, the "in situ" and the "ex situ" technique. A recent description of these techniques has been given by E. Collings et al. (*Supercond. Sci. Technol.* 21(2008)103001).

The "in situ" technique is characterized by the fact that $MgB_2$ phase in the filaments is formed by a reaction between B and Mg powder particles at temperatures between 500 and 1000° C., at the end of the deformation to a wire by conventional swaging, drawing or rolling procedures.

This is in contrast to the "ex situ" technique, where the wire deformation is performed on filaments containing already reacted $MgB_2$ powder particles. The scope of the final heat treatment of "ex situ" wires is thus a sintering of the powder mixture in the filaments for improving the connectivity between the $MgB_2$ grains.

The structure of $MgB_2$ is hexagonal, with a strong anisotropy of the superconducting critical fields $B_{c2}$ and $B_{irr}$. It follows that the superconducting critical current density $J_c$ in a $MgB_2$ wire also shows anisotropic behavior depending on the orientation of the applied magnetic field with respect to the tape surface. In the case of ex situ $MgB_2$ tapes a strong anisotropy of $J_c$ is observed (Lezza et al., *IEEE Trans. Appl. Supercond.* 15(2005)3196), which is due to the fact the original powder mixture already contains $MgB_2$ crystallites which will align along the wire axis during deformation.

The situation is more complex for in situ tapes, where the texture of the $MgB_2$ phase in the filaments after reaction is influenced by the energy transmitted during the initial homogenization ball milling of the powder mixture the Mg+B+additives. Indeed, high energy ball milling, performed with W balls and vails for times up to 100 hours, transforms up to 30% of the total powder to $MgB_2$ (mechanical alloying). Tapes produced with these powders exhibit a marked anisotropy of $J_c$, as reported by Kováč et al. (*Supercond. Sci. Technol.* 21(2008)015004).

In powders homogenized by low energy ball milling using agate balls and vails during times up to 4 hours, no $MgB_2$ is observed by X ray analysis. This means that either only a very small amount of $MgB_2$ phase has been formed (<2%) or that the $MgB_2$ grains have a size below 15 nanometer and cannot be detected. The consequence is a very low degree of texturing in the reacted tape, and a low anisotropy of $J_c$.

The enhancement of the critical current density, $J_c$, in $MgB_2$ wires has been the subject of numerous publications. The most effective way to enhance $J_c$ in $MgB_2$ wires is the introduction of additives to the initial powder mixtures. Several kinds of additives have been proposed, consisting partly or entirely by Carbon, which substitutes Boron in the $MgB_2$ phase up to 20 at. %. The most known additive is SiC (S. X. Dou et al., *Appl. Phys. Lett.* 81 (2002) 3419) or Carbon (R. H. T. Wilke et al., *Phys. Rev. Lett.* 92(2004) 217003).

Other ternary additives have led to an increase of $J_c$ in wires and tapes prepared by the in situ technique: $B_4C$ (P. Lezza et al. *Supercond. Sci. Technol.* 19(2006)1030) and a series of carbohydrates, e.g. malic acid, $C_4H_6O_5$ (M. S. A. Hossain et al., *Supercond. Sci. Technol.* 20(2007)L51). Finally, combinations between additives have been introduced, e.g. $B_4C$+SiC (R. Flükiger et al., *IEEE Trans. Appl. Supercond.* 17(2007)2846) or carbohydrates +SiC (H. Yamada et al., *Supercond. Sci. Technol.* 20(2007)L30).

For all the above mentioned additives, the partial substitution of Boron by Carbon causes a decrease of the atomic order parameter in the hexagonal $MgB_2$ structure, thus causing an increase of the electrical resistivity and thus a higher critical field. At the same time, a decrease of $T_c$ is observed in the filaments, from ~39 K for binary $MgB_2$ to ~28K K for 12 at. % substituted Carbon. It follows that the optimum $J_c$ will be obtained by a compromise between the C content and the value of $T_c$.

In all prior art published at the present day, deformation and final heat treatment of industrial superconducting $MgB_2$ wires are performed at ambient pressure. In two cases, reaction heat treatments under high pressures have been reported, tapes or pressed pellets having been submitted to a HIP (Hot Isostatic Pressing) treatment (Serquis et al., *Appl. Phys. Letters*, 82(2003,2847), while bulk samples have been prepared by a multianvil press (Prikhna et al., *Physica C: Superconductivity*, 372-376(2002)1543). However, this is fundamentally different from the present application, the use of these devices being limited to very small sample dimensions: from 1 to 2 $cm^3$ to <100 $mm^3$, respectively. This excludes their use on long wires.

It has to be noted that both, HIP and hot multianvil processing do not describe a cold compression step on the elongated deformed green sample prior to the final heat treatment.

In contrast to the previous works, it is an object of the present invention to provide a method producing a superconductive wire which leads to a substantial increase of the critical current density $J_c$, its values being enhanced by a factor up to 2.8 at 4.2K and a magnetic field of 10 T. At the same time, the anisotropy factor $\Gamma=J_c$(parallel): $J_c$(perpendicular), where the magnetic field is applied either parallel or perpendicular to the tape surface, should be almost not affected by this new procedure, which is important in view of industrial applications requiring isotropic or almost isotropic wires or tapes.

SUMMARY OF THE INVENTION

These objects are achieved by a method according to the independent claim including a cold high pressure densification procedure characterized in that the material of the filaments in the intermediate element—which is at that time not yet superconductive—is densified in one or more high pressure densification steps following up the deformation step, said densification steps comprising a simultaneous action of at least 4 hard surfaces perpendicular to the axis of the elongated intermediate element, building up high pressure P≧100 MPa on a part of the intermediate element having an axial length L, and that the high pressure densification steps are followed up by the final reaction heat treatment.

The high pressure densification steps are performed at temperatures between −100° C. and +200° C., preferably at room temperature.

In a highly preferred variant of the inventive method the high pressure P in the high pressure densification steps is chosen in the range of 0.1 GPa≦P≦10 GPa, most preferably 1 GPa≦P≦3 GPa.

In a preferred variant of the inventive method the final reaction heat treatment following up the high pressure densification steps is performed under a gas pressure up to 0.4 GPa.

It is also advantageous if the polygonal cross section of the elongated intermediate element is chosen to have an area between 0.25 mm$^2$ and 50 mm$^2$, preferably between 2 mm$^2$ and 15 mm$^2$.

Particularly preferred is a variant of the method according to the invention in which the elongated intermediate element is subjected to a repeated pressing and release cycle including several high pressure densification steps, whereby the hard surfaces are moved away after each high pressure densification step, thus releasing the pressure on the intermediate element.

Most preferably, after one or more high pressure densification steps the intermediate element is subjected to a forward movement in axial direction by a length L1, where L1<L, after which the hard surfaces are brought back to their original radial position with respect to the intermediate element, followed by the application of high pressure in a further high pressure densification step.

In particular, the overlapping region between two successive pressed lengths of the intermediate element should be chosen to be smaller than L/2, and the cycle consisting of densification, pressure release and forward movement should be repeated up to the total length of the intermediate element.

In a preferred variant of the inventive method the sequence of densification, pressure release and forward movement is synchronized, the number of pressing cycles varying between 1 and 100 per second, preferably 5 to 10 per second.

Favorably, any corners of the intermediate element are rounded off by a drawing step following up the high pressure densification steps.

In a preferred embodiment of the invention, the initial element used in the inventive method is chosen such that the superconductive filaments are separated from the matrix and from the conductive ohmic element by a protective metallic layer.

A preferred variant of the method according to the invention is characterized in that the filaments contain powder mixtures chosen from the group of Boron, Magnesium and one or more additives with a total Carbon content varying between 0 and 20 wt. % and that a $MgB_2$ phase is formed after an "in situ" reaction between 500° C. and 1000° C. or that the filaments contain already formed (="ex situ") $MgB_2$ powder mixtures containing between 0 and 20 wt. % Carbon, and that the filaments are submitted to a sintering treatment at temperatures between 600° C. and 1000° C. and being separated from the metallic matrix, which is preferably comprising Cu, by a Nb,Ta, Ni or Ti barrier.

In an alternative variant of the inventive method the filaments contain powder mixtures of $NbSn_2$ and one or more additives, in particular up to 10 wt. % Sn and Cu, a $Nb_3Sn$ phase being formed by a reaction at temperatures between 550° C. and 800° C. and being separated from the metallic matrix, which is preferably comprising Cu, by a Nb barrier.

In another alternative variant the filaments contain powder mixtures chosen from the group of Mo, Pb, Sn and S, a phase $PbMo_6S_8$ (=Chevrel phase) being formed by a reaction at temperatures between 800° C. and 1100° C. and being separated from the metallic matrix, which is preferably comprising Cu, by a barrier chosen from the group of Mo, Nb and Ta.

In a further alternative variant the filaments contain powder mixtures chosen from the group of As, Fe and oxides based on an earth alkaline ($X^1$) and an alkaline element ($X^2$), a phase $X^1_{1-x}X^2_xFe_2As_2$ being formed by a heat treatment at temperatures between 800° C. and 1100° C. and being separated from the metallic matrix, which is preferably comprising Cu, by a Nb or Ta barrier.

The present invention also includes a high pressure generating device comprising at least four hard metal surfaces for performing the above described inventive method. A preferred embodiment of this device comprises exactly four hard metal surfaces, namely a bottom surface, two lateral surfaces and a top hard metal surface which are simultaneously acting on a length L between 5 and 50 mm of the intermediate element, perpendicular to its axis. Most preferably, the high pressure generating device according to the present invention is adapt to building up high pressure P varying between 0.1 and 10 GPa during a period T1 between 0.1 and 10 seconds, causing a densification of the pressed portion, the density being increased by at least 5% with respect to the unpressed wire or tape.

Further advantages of the invention can be derived from the description and the drawings. The features stated above and below can also be used singly or in any combination. The variants and embodiments shown and described are not an exhaustive account but are provided as examples to explain the invention.

BRIEF DESCRIPTION OF THE DRAWING

The invention is shown in the drawing and is explained in more detail using examples. The figures show.

DESCRIPTION OF THE PREFERRED EMBODIMENT

The invention relates to a procedure for the densification of matter by intermittent high pressure action on the powder mixtures inside the filaments 1 of an elongated intermediate element 5 obtained by deforming an initial element for the production of a superconductive wire, whereby one or more high pressure densification steps are performed after the deformation of the initial element and just before application of the final heat treatment upon the intermediate element 5.

The superconductive element can in particular be a monofilament or a multifilament wire or tape with filaments 1 of a size between 10 µm and 1 mm, which are enclosed in a metallic matrix 2 and also comprise a highly conductive ohmic element 4, usually Cu.

Figure 1:
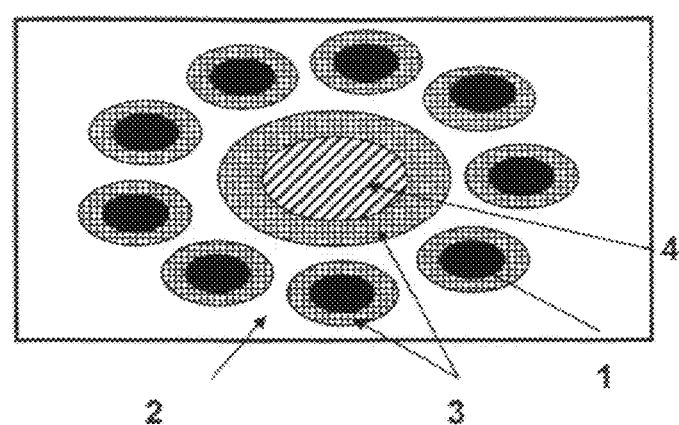
FIG. 1 a schematic cross-sectional view of a first embodiment of superconductive multifilament wire with the filaments surrounding the conductive ohmic element.
Figure 2:
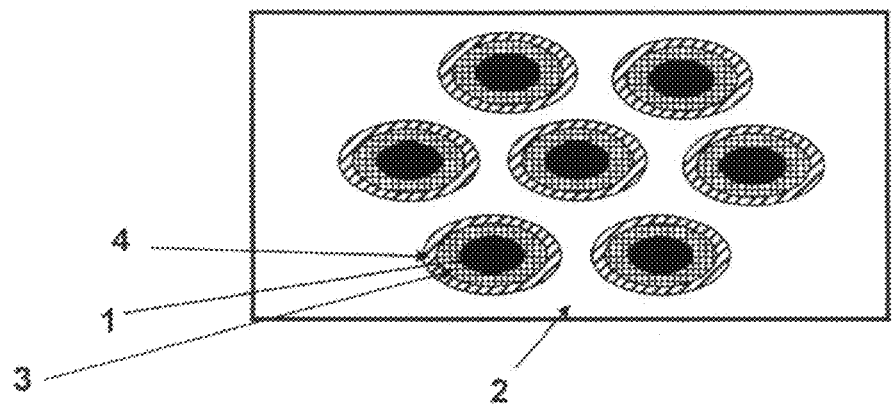
FIG. 2 a schematic cross-sectional view of a second embodiment of superconductive multifilament wire with each of the filaments being surrounded by a conductive ohmic element.

In most cases, the superconducting filaments 1 are separated from the matrix 2 and from the conductive element 4 by a protective metallic layer 3 as shown in FIGS. 1 and 2.

The metallic layer 3 is composed of an element—or an alloy—which does not react with the matrix 2 and shows a negligible reaction with the powder mixture during the reaction or the sintering heat treatment.

The invention introduces a special application of high pressure processing on a long wire with an aspect ratio comprised between 1:1 and 1:20. Prior to the proposed cold high pressure densification, the mono-filamentary or multi-filamentary wire is deformed by swaging, drawing and rolling processes.

The press used for the intermittent operation is a hydraulic press producing more than 40 tons acting on a top piece having a moving hard metal surface 8, which in turn transmits the pressure to the intermediate element 5 and to the other hard metal surfaces 6 and 7.

The high pressure device comprises four hard metal surfaces, namely a bottom surface 6, two lateral surfaces 7 and a top hard metal surface 8 which are simultaneously acting on a length L between 5 and 50 mm of the element 5, perpendicular to its axis, building up a pressure P varying between 0.1 and 10 GPa during a period T1 between 0.1 and 10 seconds, causing a densification of the pressed portion, the density being increased by at least 5% with respect to the unpressed wire or tape.

After a pressing step, the pressure P is released and the hard metal surfaces are moved, allowing the forward movement of the intermediate element 5. The forward movement occurs by a length L1≦L, the overlapping with the last pressed length L being smaller than 50%, i.e. L1≦0.5 L.

Figure 3:
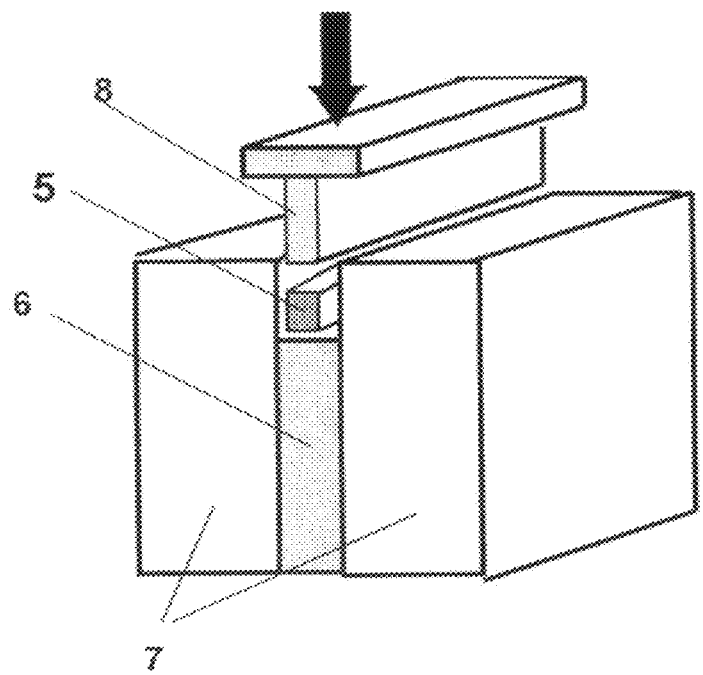
FIG. 3 a schematic view of a high pressure generating device comprising four hard metal surfaces for performing the high pressure densification steps shown during the pressure application mode.
Figure 4:
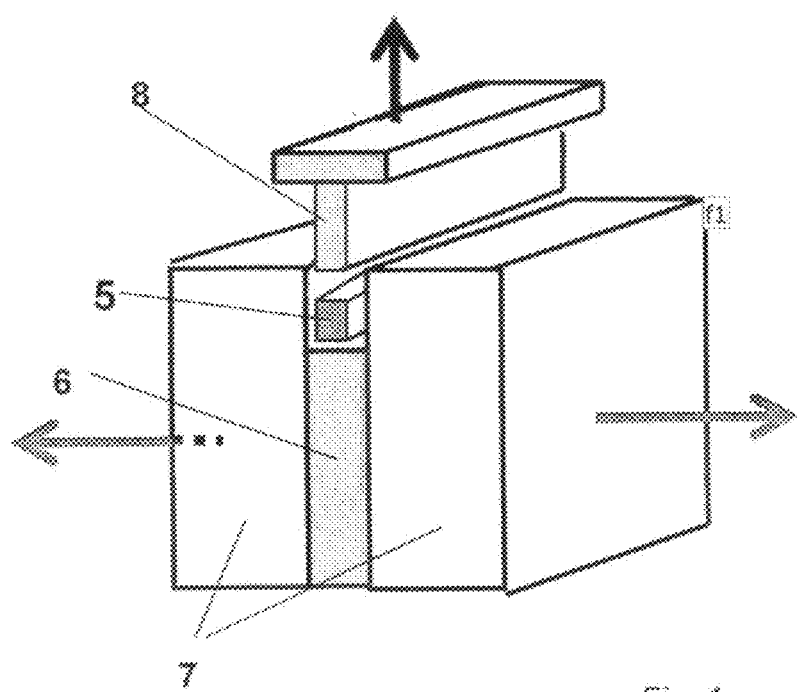
FIG. 4 the device of FIG. 3 shown during the pressure release mode.

The motion of the hard metal surfaces is reversible, in order to reconstruct the identical pressing configuration for the next pressing step after the relaxing time T2, which ranges from 0.1 s to 1 s. It is important that there is no space between the four hard surfaces shown in FIGS. 3 and 4. The surfaces 6 and 7 are strongly pressed against each other, the surface 8, the pressing tool acting like a piston. The presence of spaces would lead to material flow between the surfaces 6, 7 and 8, which would lead to inhomogeneities of the material contents inside the wire.

The sequence pressure application—pressure release—forward movement is repeated up to the whole length of the intermediate element 5. The particularity of the present intermittent high pressure procedure resides in the application of a very high pressure, between 0.1 GPa and 10 GPa, on wire lengths of more than 100 m. This cannot be performed in a continuous method.

The present configuration for intermittent high pressure application is designed to obtain an almost homogeneous pressure distribution inside the element. This means in particular that no additional anisotropy of the critical current density $J_c$ in the reacted $MgB_2$ wire is built up. The motion of the hard metal surfaces and of the element is synchronized by means of hydraulic or electronic means, monitoring the times T1 and T2 of the intermittent operation.

The present intermittent high pressure procedure can be applied to all kind of superconducting wires containing powder mixtures, regardless whether the final heat treatment is performed for a reaction or just for sintering purposes. It is applicable for in situ $MgB_2$ and ex situ $MgB_2$ wires, for $Nb_3Sn$ wires produced by the so-called PIT (Powder-in-Tube) technique, for the Chevrel phases represented by the formula $PbMo_6S_8$, but also for newly discovered superconducting compounds, represented by the formula $Ba_{1-x}Sr_xFe_2As_2$.

SPECIAL EXAMPLES

1. Carbon Added $MgB_2$ Element

A $MgB_2$ wire with 8 wt. % Carbon additives, produced by the in situ technique has first been deformed to a wire and then rolled to a tape of 0.35×2.5 mm² cross section. After cold high pressure densification under 1.5 GPa and reaction at 900° C. for 1 h, the critical current density showed a strong increase, the value (with parallel magnetic field) at 4.2K/12 T being 1×10⁴ A/cm² (see FIG. 5) an increase of $J_c$ by a factor 2.8. At 20K and 5 T, the enhancement is of the order of 2.5.

Figure 5:
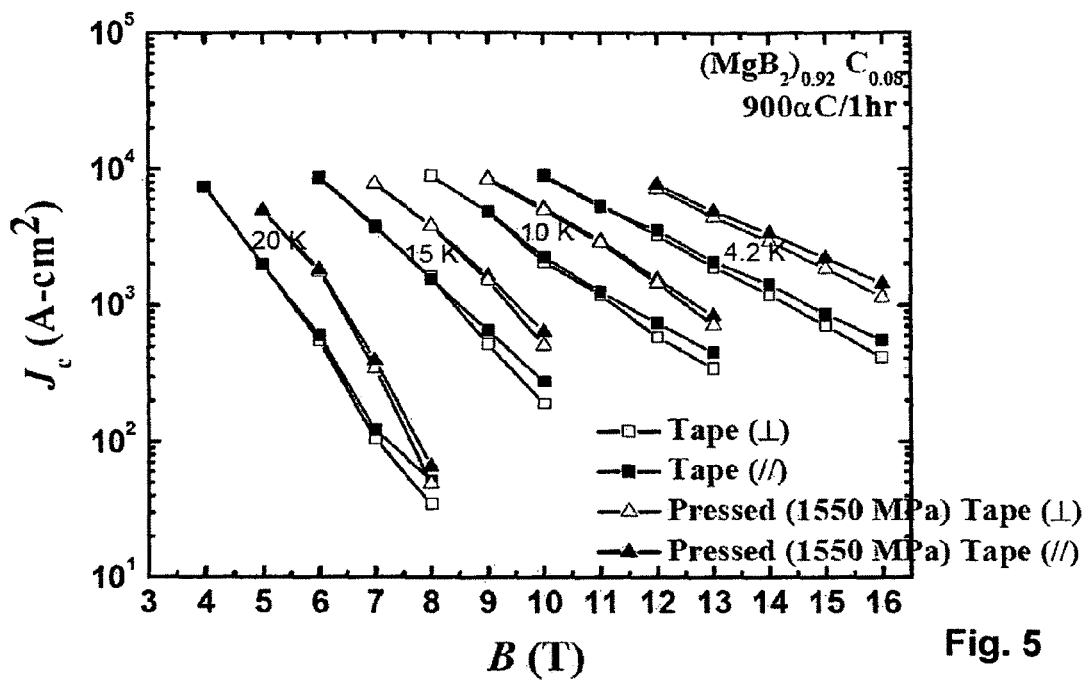
FIG. 5 variation of $J_c$ vs. B for a "in situ" $MgB_2$ with 8 wt. % Carbon additives, without and with cold high pressure densification, where an enhancement of $J_c$ by a factor >2.5 was observed.

FIG. 5 also shows the behavior of $J_c$ for both magnetic field directions, parallel and perpendicular to the tape surface. It is seen that the anisotropy ratio Γ of $J_c$ between both field directions is close 1 and that the tape shows an isotropic behavior below 4.2K/10 T. This demonstrates that the cold high pressure densification does not lead to an increase of the anisotropy factor Γ.

2. $MgB_2$ with Malic Acid ($C_4H_6O_5$) Additive

A $MgB_2$ wire with 10 wt. % malic acid ($C_4H_6O_5$) additive produced by the in situ technique has first been deformed to a wire and then rolled to a tape of 0.55×3.5 mm² cross section. After cold high pressure densification under 1.45 GPa and reaction at 650° C. for 1 h, the critical current density the magnetic field increased to 1×10⁴ A/cm² at 4.2K and 13 T (see FIG. 6).

Figure 6:
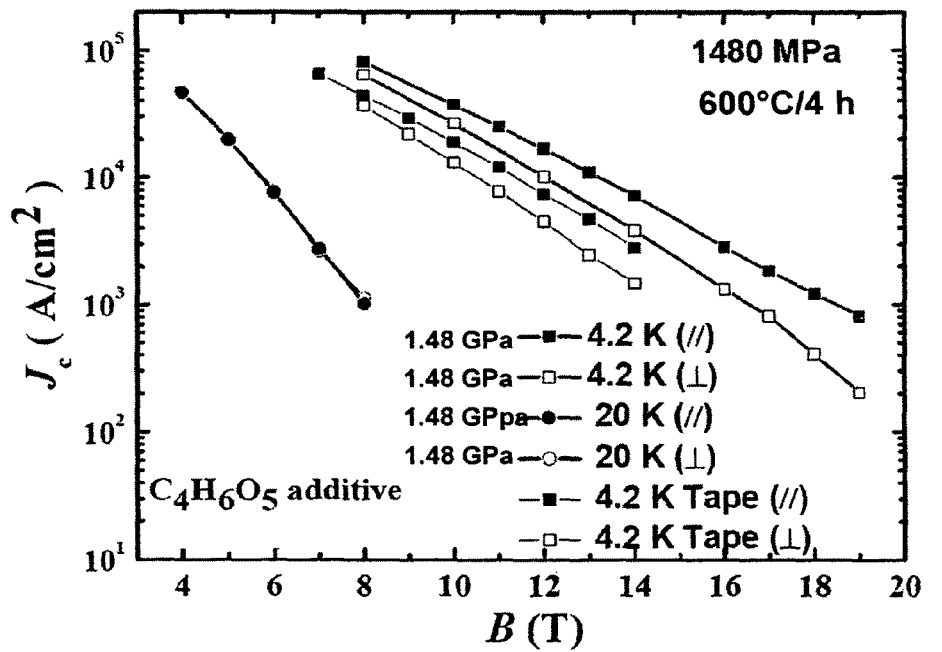
FIG. 6 variation of $J_c$ vs. B for a "in situ" $MgB_2$ with 10 wt. % malic acid ($C_4H_6O_5$) additives, without and with cold high pressure densification, where an enhancement of $J_c$ by a factor >2.5 was observed.

From FIG. 6 one can see how the cold high pressure densification leads to a strong enhancement of $J_c$ at 4.2K. The presently obtained values $J_c$=1×10⁴ A/cm² at 4.2K at 13.3 T (parallel field direction) and 12 T (perpendicular field direction) are the highest values obtained so far, illustrating the effect of the present invention.

I claim:

1. A method for producing a superconductive wire from an initial element, the completed superconductive wire having one or more superconductive filaments with a diameter between 2 µm and 5 mm which are enclosed in a metallic matrix, the superconducting wire also having at least one highly conductive ohmic element, the method comprising the steps of:
   a) executing a deformation step in which the initial element is subjected to a sequence of swaging, drawing or rolling deformations to form an elongated intermediate element with polygonal cross section;
   b) densifying, following step a), material of the filaments in said intermediate element in one or more high pressure densification steps, the densification steps effecting simultaneous action of at least 4 hard surfaces perpendicular to an axis of the elongated intermediate element, thereby exercising high pressure P≧100 MPa on a part of the intermediate element having an axial length L; and
   c) forming, following step b), the superconductive filaments in a reaction heat treatment between 300° C. and 1200° C.

2. The method of claim 1, wherein the high pressure densification steps are performed at temperatures between −100° C. and +200° C. or at room temperature.

3. The method of claim 1, wherein the high pressure P in the high pressure densification steps is chosen in a range of 0.1 GPa≦P≦10 GPa or 1 GPa≦P≦3 GPa.

4. The method of claim 1, wherein the reaction heat treatment following the high pressure densification steps is performed under a gas pressure up to 0.4 GPa.

5. The method of claim 1, wherein the polygonal cross section of the elongated intermediate element has an area between 0.25 mm² and 50 mm² or between 2 mm² and 15 mm².

6. The method of claim 1, wherein the elongated intermediate element is subjected to a repeated pressing and release cycle including several high pressure densification steps, wherein the hard surfaces are moved away after each high pressure densification step, thereby releasing the pressure on the intermediate element.

7. The method of claim 6, wherein, after one or more high pressure densification steps, the intermediate element is subjected to a forward movement in an axial direction by a length L1, where L1<L, after which the hard surfaces are brought back to original radial positions thereof with respect to the intermediate element, followed by application of high pressure in a further high pressure densification step.

8. The method of claim 7, wherein an overlapping region between two successive pressed lengths of the intermediate element is smaller than L/2, and a cycle consisting of densification, pressure release and forward movement is repeated up to a total length of the intermediate element.

9. The method of claim 7, wherein a sequence of densification, pressure release and forward movement is synchronized, a number of pressing cycles varying between 1 and 100 per second or between 5 to 10 per second.

10. The method of claim 1, wherein corners of the intermediate element are rounded off by a drawing step following the high pressure densification steps.

11. The method of claim 1, wherein the superconductive filaments are separated from the matrix and from the conductive ohmic element by a protective metallic layer.

12. The method of claim 1, wherein the filaments contain powder mixtures chosen from the group of Boron, Magnesium and one or more additives with a total Carbon content up to 20 wt. %, wherein a $MgB_2$ phase is formed after an "in situ" reaction between 500° C. and 1000° C. or the filaments contain previously formed (="ex situ") $MgB_2$ powder mixtures containing up to 20 wt. % Carbon, wherein the filaments are subjected to a sintering treatment at temperatures between 600° C. and 1000° C. and are separated from the metallic matrix, by a Nb,Ta, Ni or Ti barrier.

13. The method of claim 12, wherein the metallic matrix comprises Cu.

14. The method of claim 1, wherein the filaments contain powder mixtures of $NbSn_2$ and one or more additives, a $Nb_3Sn$ phase being formed by a reaction at temperatures between 550° C. and 800° C. and being separated from the metallic matrix by a Nb barrier.

15. The method of claim 14, wherein the filaments contain up to 10 wt. % Sn and Cu and the metallic matrix comprises Cu.

16. The method of claim 1, wherein the filaments contain powder mixtures chosen from the group of Mo, Pb, Sn and S, a phase $PbMo_6S_8$(=Chevrel phase) being formed by a reaction at temperatures between 800° C. and 1100° C. and being separated from the metallic matrix by a barrier chosen from the group of Mo, Nb and Ta.

17. The method of claim 16, wherein the metallic matrix comprises Cu.

18. The method of claim 1, wherein filaments contain powder mixtures chosen from the group of As, Fe and oxides based on an earth alkaline ($X^1$) and an alkaline element ($X^2$), a phase $X^1_{1-x}X^2_xFe_2As_2$ being formed by a heat treatment at temperatures between 800° C. and 1100° C. and being separated from the metallic matrix by a Nb or Ta barrier.

19. The method of claim 18, wherein the metallic matrix comprises Cu.

* * * * *